United States Patent [19]

Argentieri

[11] Patent Number: 4,782,299

[45] Date of Patent: Nov. 1, 1988

[54] METHODS OF ARC AND CORONA MONITORING FOR HIGH VOLTAGE GENERATORS

[75] Inventor: Michael A. Argentieri, West Orange, N.J.

[73] Assignee: ITT Avionics, A Division of ITT Corporation, Nutley, N.J.

[21] Appl. No.: 23,363

[22] Filed: Mar. 9, 1987

[51] Int. Cl.$^4$ ............................................. G01R 31/12
[52] U.S. Cl. ...................................... 324/501; 324/72; 324/456
[58] Field of Search ...................... 250/385, 392, 475.2; 324/73 PC, 501, 553, 456, 514, 72

[56] References Cited

U.S. PATENT DOCUMENTS

| | | | |
|---|---|---|---|
| 2,669,692 | 2/1954 | Pearson | 324/456 |
| 3,991,302 | 11/1976 | Danner | 324/73 PC |
| 4,316,089 | 2/1982 | Aoyama | 250/389 |
| 4,507,605 | 3/1985 | Geisel | 324/501 |

FOREIGN PATENT DOCUMENTS 2300436 11/1973 Fed. Rep. of Germany ... 324/73 PC

Primary Examiner—Reinhard J. Eisenzopf
Assistant Examiner—Jose M. Solis
Attorney, Agent, or Firm—Robert A. Walsh; Thomas N. Twomey; Mary C. Werner

[57] ABSTRACT

There is disclosed a method for determining the location of an arc or corona as occurring in a high voltage power supply. The technique utilizes sheets of sensitive photographic film which are placed between printed circuit boards of the supply or between high voltage components and the metallic chassis walls of the power supply. During supply operation if an arc or corona occurs the film becomes exposed. The amount of exposure is determinative of the magnitude of the arc as well as indicative of the location of the arc or corona discharge which location and magnitude is determined by developing the film after supply operation. In this manner a comparative analysis of the amount of corona or arc as a function of time can be made by comparing the film density after photographic chemical development. The technique enables one to, therefore, accurately determine not only the magnitude of the arc or corona discharge but the exact location of the same.

19 Claims, 1 Drawing Sheet

METHODS OF ARC AND CORONA MONITORING FOR HIGH VOLTAGE GENERATORS

This invention was made with Government support under Contract No. N00019-81-C-0369 awarded by the Department of the Navy. The Government has certain rights in this invention.

BACKGROUND OF THE INVENTION

This invention relates to a technique for monitoring arc and corona discharge in high voltage generators and more particularly to a method of employing film for monitoring arc and corona discharge in high voltage power supplies.

As one can ascertain, high voltage power supplies are widely employed in the electronics and industrial fields. These supplies normally generate tens of thousands of volts and are utilized, for example, to supply operating potential to cathode ray tubes, in high power transmitters and numerous other applications. For an example of the uses of high voltage power supplies, reference is made to a text entitled "Principles of Solid State Power Conversion" by Ralph E. Tarter, published by Howard W. Sams & Company (1985). As one can ascertain, such high voltage power supplies are associated with the generation of extremely high voltages. Based on the high voltages involved, substantial arcing and corona discharge can occur in supply operation due to the electrical breakdown of gas, air or dielectric which surrounds the components utilized in such supplies.

Essentially an arc is a continuous luminous discharge of electricity which can occur across an insulating medium and essentially is characterized by a voltage drop in an immediate vicinity of the point that the arc occurs to another point in which the arc is directed.

A corona discharge is a luminous discharge which is due to the ionization of the air surrounding a conductor which is caused by a voltage gradient exceeding a certain critical angle. Such corona discharges can also occur in a gas filled environment causing a discharge with a slight luminosity which is produced in the neighborhood of a conductor without greatly heating the conductor and is usually limited to the regions surrounding the conductor in which the electric field exceeds a certain value. In any event, due to the extremely high voltages that these supplies are designed to operate at, such supplies experience both corona and arc discharge if proper precautions are not taken.

It is apparent that both effects are normally due either to a malfunction in the power supply or an inherent design deficiency which essentially results in corona and/or an arc discharge. The design defect or malfunction can occur in many ways. For example, such power supplies utilize printed circuit boards whereby components are placed in terminal areas on the board and then soldered to the board. In any event, in a high voltage power supply, the soldering of components should be carefully implemented and one cannot have, for example, extending sharp projections when implementing solder joints. These projections form potential arc points whereby an arc can be directed from the solder joints to other areas involved with the power supply or vice versa. The nature of an arc or corona is such that it is completely random and can occur based on spacing, heating and other factors as well. In any event, it is desirable to note the exact location of the arc so as to make a determination of where the arc occurred in the supply to enable the designer or user of the supply to make the necessary repairs in order to assure that such a malfunction does not occur again.

The present state of the art equipment which is available operates to measure electrical field stresses in a high voltage power supply such as corona and/or arcs. This apparatus is limited to measuring the EMI (electromagnetic interference) which provides external fields relating to arcs and coronas and as they affect the input leads to the power supply. This type of measurement is extremely difficult to quantify and does not pinpoint the internal source or location of the arc or corona. In any event, the prior art techniques, as indicated above, which includes equipment to measure such events really monitors the input power leads to the power supply to determine whether or not there are high frequency components present which high frequency components are normally generated by the creation of arc or corona discharges.

These techniques, as briefly described, do not pinpoint or indicate to the designer or user the location of the arc. Hence, by using prior art techniques one knows that an arc has occurred but does not know where the arc emanated from.

One can also ascertain that due to the nature of an arc or corona discharge the entire operation may be extremely intermittent and may not occur on a continuous basis. An arc or corona discharge may be a function of the humidity, the temperature and various other factors which will cause the creation of the arc or corona discharge. Hence, one may experience arcs or arc events in high voltage power supplies which are relatively random and do not continuously occur. The prior art equipment for measuring such techniques makes the measurement of such random events extremely difficult, if not impossible, and as indicated above does not allow the designer or user to determine the exact location of the arc.

It is therefore an object of the present invention to provide a method for determining arc and corona discharge in a high voltage power supply.

It is a further object of the present invention to utilize a photographic film, which is placed at strategic locations throughout the power supply, which film will become exposed upon the generation of a corona or an arc discharge to allow a designer or user to accurately and precisely determine the location of the arc, as well as to quantify the extent and magnitude of the arc.

BRIEF SUMMARY OF THE INVENTION

A method for monitoring the generation of a luminous discharge event associated with the malfunction of a high voltage generator which generator contains high voltage generating components located in the hollow of a housing shielded from ambient light comprising the steps of placing photographic film at various locations within the housing and positioning the film with respect to the components to cause the film to be exposed upon the generation of the discharge when the generator is providing high voltage, and developing the film after exposure to determine the location of the discharge.

BRIEF DESCRIPTIONS OF FIGURES

DETAILED DESCRIPTION OF INVENTION

Figure 1:
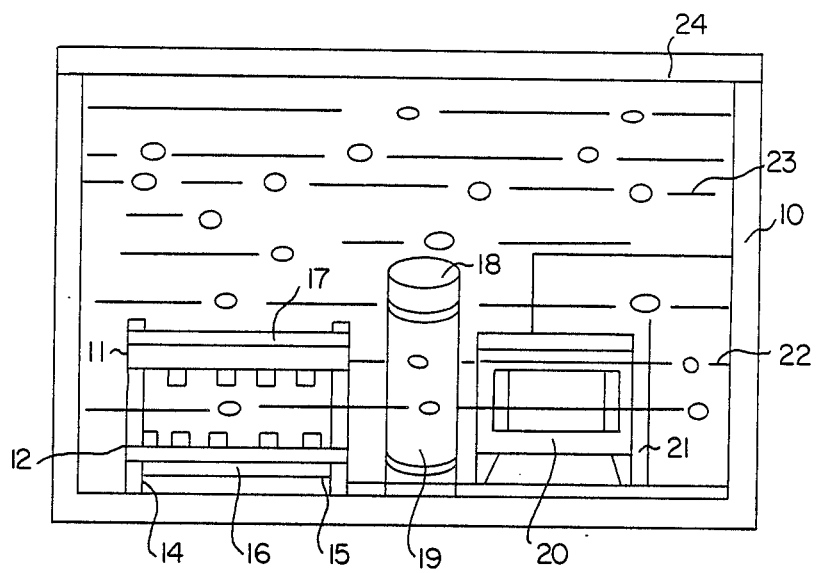
FIG. 1 is a diagrammatic representation of a typical high voltage power supply.

Referring to FIG. 1 there is shown a generalized version of a typical high voltage power supply 10. Essentially, a high voltage power supply is contained within a suitable housing which completely surrounds all the components. Many high voltage power supplies which operate at extremely high voltage are conventionally filled with a dielectric liquid such as, for example, a liquid produced by the Minnesota Manufacturing and Mining Company, designated as 3M Fluorinert. This liquid is a typical dielectric liquid which is widely utilized to fill high voltage power supplies in order to provide a high dielectric and essentially to avoid arc discharge. The typical high voltage power supply 10, as shown in FIG. 1, is contained within a metallic housing which completely surrounds all the components contained therein. The housing may have a top cover as 24 and is covered at the bottom and at all sides thus effectively providing a shield for ambient light.

Conventionally contained within the power supply is a series of printed circuit boards, such as boards 11 and 12, which may be coupled to the power supply chassis or mounted to the power supply chassis by means of high voltage standoffs or insulating terminals as 14 and 15. The printed circuit boards as 11 and 12 conventionally contain various components necessary to generate the high voltages required as well as regulation of the supply and various other factors which are well known in the prior art.

Many high voltage power supplies, as well as generators, contain capacitive elements such as 18 which may be tubular capacitors or capacitors of other configurations. Such supplies also contain transformers as 20 for the generation of appropriate voltages from an AC power source and various other housing modules such as 22 which may contain other high voltage components. Essentially, as one will understand and which is apparent in regard to the prior art, great care is taken in the design and implementation of high voltage power supplies to assure that the various components, as for example shown in FIG. 1, are suitably spaced and suitably insulated to withstand the high voltages which are generated by the supplies.

In any event, a major problem with such supplies, as indicated above, is the generation of arcs or coronas which result from the extremely high voltages employed in the supplies. Such arcs or coronas may be generated and developed at many points within the supply. A typical source of generation of arcs as indicated above is the solder joints which are associated with the printed circuit boards. As one can ascertain, a component is emplaced in a printed circuit board and then soldered in place via feed-through terminals. The soldered component as implemented may have sharp points associated with it due to the soldering technique. In any event, these points act as stress points and essentially present points at which arcs can be generated from or directed to. The generation of arcs or corona discharge can occur about wires in the supply or from one component to another, such as from a printed circuit board to the capacitor 18 or from the transformer 20 to the housing 22.

Essentially there are a number of points of concern in a power supply which the designer understands can cause the generation of arcs or coronas. According to this invention there is emplaced, throughout the power supply, sheets of photographic film such as 16, 17, 19 and 21. The film is essentially sheet film, such as the conventional type utilized in the generation of printed circuit graphics, and available from many film manufacturers. According to this invention the sheets of film, as 16 and 17 as well as 19 and 21, are positioned in the power supply at strategic locations. As seen from FIG. 1, sheets of film as 16 and 17 are placed between the printed circuit boards of the high voltage power supply or between high voltage components and the supply metallic chassis walls. Additionally, a sheet of film, as 19, is wrapped around the capacitor 18 while another sheet of film 21 is placed between the transformer 20 and the high voltage component housing 22. Sheets 16 and 17 are also placed between the printed circuit boards. Thus, sheets of photographic film are strategically placed within the power supply at locations which are associated with electrical stress levels. The completed power supply 10, after manufacture or fabrication, is then taken into a dark room which is a conventional photographic dark room. In this manner the sheets of film are placed within the power supply by the designer according to his understanding of anticipated electrical stress areas which are present in the power supply. The film, of course, is unexposed and may be suitably protected from ambient light by means of a solid light repellent backing material, such as a thick black paper or other material for protecting film. Such techniques are widely known and many films are available with such protective backings. In any event, the sensitive portion of the film, or that portion of the film containing the light sensitive material, is positioned so that it monitors an area in which an arc or an electrical discharge can occur.

As one can ascertain, both the arc and corona discharge are associated with a luminous discharge which produces light. In this manner the photographic film is placed throughout the supply as, for example, shown in FIG. 1. The supply is then operated. After operation the film is then developed and a comparative analysis of the amount of corona or arc discharge as a function of time is made by comparing the film density after photographic chemical development at the various event locations. The use of the film enables one to produce a quantitative comparison after a suitable standard is empirically determined. The photographic film, as indicated above, can be a permanent part of the high voltage power supply since the film does not effect the supply or the supply dielectric. As indicated above, a typical dielectric for a high voltage supply is the 3M Fluorinert dielectric liquid and this liquid does not effect the sensitivity of the film.

If a malfunction occurs in a power supply, one can ascertain the exact malfunction by developing the film and in this manner can exactly pinpoint the location of an event that resulted in an arc or corona stress and a quantitative analysis can be concluded or conducted.

Figure 2:
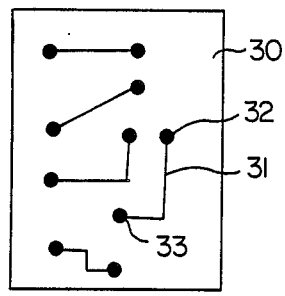
FIG. 2 is a top plan view of a printed circuit board useful in explaining the operation of this invention.

Referring to FIG. 2 there is shown a bottom plan view of a typical printed circuit board 30 which board is similar to boards 16 and 17. It is of course understood that the exact format of the printed circuit board is not depicted accurately by board 30 but the example is given for explanation purposes.

As seen from FIG. 2 a printed circuit board 30 is usually fabricated from an insulator material, many examples of which are known in the prior art. The printed circuit board 30 contains terminals such as 32 and 33 which are normally connected by printed circuit conductive paths as 31. Emplaced in the terminals are suitable components. As indicated, the components are normally soldered either by hand or by conventional automatic soldering techniques, such as wave soldering and so on. In any event, if the solder joints associated with the terminals as 32 and 33 contain sharp points, these may be potential points for the generation of arcs due to the high voltage employed.

A piece of photographic film or a sheet of photographic film as 16 and 17 is emplaced beneath or in close proximity to the printed circuit board with the sensitive photographic area facing the same.

Figure 3:
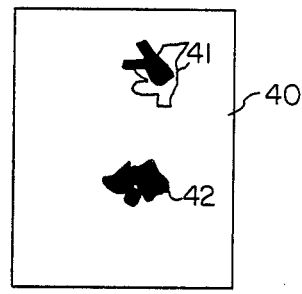
FIG. 3 is a top plan view of a sheet of film utilized in conjunction with this technique.

Essentially the sheet of photographic film as shown in FIG. 3 as 40 is, as indicated, a standard photographic film widely utilized in the electronics industry for many purposes. As one can ascertain from FIG. 3, if an arc occurs between any of the monitored areas then the film will be exposed at that area due to the luminescent discharge associated with the arc or the corona. In this manner the film becomes exposed according to the light intensity which emanated from the arc or the corona.

As shown in FIG. 3, there are two spots or areas as 41 and 42 indicative of exposure of the film causing it to darken at those locations. Since the sheet of film 40 is relatively the same size as the printed circuit board 30 and since it overlays the printed circuit board in congruency one can immediately ascertain the exact location where the arc or corona occurred by essentially looking at the exposed areas of the photographic film sheet 40. The sheet of film basically constitutes a map of the printed circuit area.

As indicated, the darkness of the exposed areas as 41 and 42 is indicative of the amount of light which emanated from the arc. Hence, by empirically exposing film under various lighting conditions one can devise an indication of the magnitude or density of the arc by checking the amount of exposure which occurs on the film. Hence, one can obtain a comparative analysis of the magnitude of corona or arc as a function of time by comparing the film density after development at the various event locations. In this manner a quantitative comparison can also be accomplished after suitable standards are empirically determined.

Figure 4:
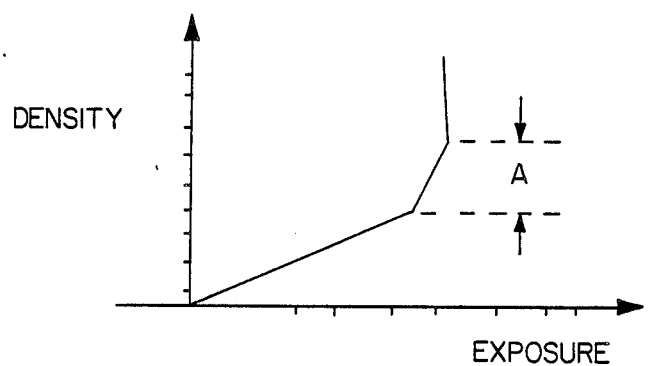
FIG. 4 is a graph depicting exposure versus density for a typical film used in practicing the methods.

Referring to FIG. 4 there is shown a graph for explaining a technique which is employed in regard to the utilization of sheet film in conjunction with high voltage power supplies. In the graph the X axis is related to exposure time while the Y axis is indicative of density of film exposure. As one can ascertain from the graph of FIG. 4, a typical photographic film has a certain response to exposure time which essentially starts at zero and is directed from the O, O point at a given slope. There is an area designated as A in which the sensitivity of the film is greater. As one can ascertain, the line section designated by A is at a sharper slope than the line emanating from the axis. In this particular area the film is more sensitive to light and produces a greater change in density for a smaller amount of exposure time. Thus, in utilizing such film one can pre-expose the film to a point where the film is extremely sensitive. This is a point where the film is up at the reciprocity curve and essentially is pre-exposed to operate in the sensitive area A. Pre-exposure of the film can be implemented by means of a safe light source which is utilized in the dark room, for example, prior to placing or positioning of the film in the power supply. A safe light source, for example, may be a red light source or a green light source depending upon the sensitivity and the characteristics of the film. Such a red light source, for example, would not normally expose the film unless the film was exposed to the source for long periods of time. In any event, one can pre-expose the film so that the film is pre-exposed to operate within the area A and hence is extremely sensitive to the generation of any external light.

As one can ascertain, the high voltage power supply, for example as shown in FIG. 1, once fabricated is completely enclosed within the housing 10. The housing 10 operates as a light shield for ambient light. This is especially true in regard to such power supplies which are filled with a suitable dielectric fluid such as 23. In this manner the entire internal hollow of the power supply is completely dark and hence the only way the film can be exposed is by the generation of an arc or corona and the film will not be exposed due to normal ambient light. Thus, as one can understand from the above description, sheets of sensitive film or photographic film are placed at various stress locations in a power supply and, for example, film is positioned between printed circuit boards with the sensitive area of the film facing the printed circuit board. Film is also placed at locations which will be prone to the generation of arcs.

Essentially, while a number of different techniques have been shown for the placing of photographic film within a power supply, one can immediately visualize that there are literally an infinite number of variations which can be associated with this technique. Hence, photographic film can be placed in many locations and such film can be wrapped around components or placed between a component and the metal chassis and essentially positioned throughout the entire power supply. The placement of the film is implemented in a dark room by the use of a safe light. Furthermore, the film can be pre-exposed so that it only operates within a sensitive area. Empirical tests can be made on the film to determine the density of the film according to the magnitude of light which impinges upon the film. As one can ascertain, the technique enables one to determine an arc or corona malfunction in a power supply and one can implement this by developing the film to pinpoint the location of a corona or arc event and then conduct a suitable quantitative analysis. As one can ascertain, the technique is extremely effective while being extremely economical and enables one to provide information regarding arc and corona discharge in a high voltage power supply which otherwise is difficult to implement utilizing prior art techniques. It is, of course, understood that the placement of photographic film in regard to apparatus which is capable of generating undesirable arcs or coronas is not limited to high voltage power supplies. Hence the technique can be utilized in conjunction with various other high voltage generating equipment which equipment is capable of generating undesirable arcs or corona discharges.

What is claimed is:

1. A method for monitoring the generation of a luminous discharge event associated with the malfunction of a high voltage generator which generator contains high voltage generating components located in the hollow of a housing shielded from ambient light comprising the steps of:

placing photographic film at various locations within said housing and positioning said film with respect to said components to cause said film to be exposed upon the generation of said discharge when said generator is providing said high voltage, and developing said film after exposure to determine the location of said discharge.

2. The method according to claim 1 wherein said high voltage generator is a high voltage power supply.

3. The method according to claim 1 including the step of first pre-exposing said film prior to placing the same to a level indicative of an increased sensitivity.

4. The method according to claim 1 further including the steps of wrapping photographic film about selected components of said generator with said sensitive film surface facing the anticipated discharge regions of said component.

5. The method according to claim 1 including the further step of analyzing said developed film to determine the density of exposure for determining the magnitude of said discharge.

6. The method according to claim 1 wherein said luminous discharge is an arc discharge.

7. A method according to claim 1 wherein said luminous discharge is a corona discharge.

8. A method for monitoring the generation of luminous discharges in a high voltage power supply, which discharges are associated with a malfunction of said supply, said supply having high voltage generating circuitry including printed circuit boards arranged in the hollow of a light shielded housing, comprising the steps of;

placing sheets of photographic film within said housing and positioning said sheets with respect to said circuitry in areas of anticipated electrical stress levels to cause said film to be exposed upon the generation of a luminous discharge when said supply is operating and thereafter developing said film to determine the location of said discharge with respect to said circuitry.

9. The method according to claim 8 further including the step of first pre-exposing said film prior to placing the same to a level indicative of increased exposure sensitivity.

10. The method according to claim 9 wherein the step of pre-exposing said film includes pre-exposing said film in a dark room with a safe light for a predetermined time.

11. The method according to claim 8 further including placing at least one sheet of film in congruency with at least one printed circuit board wherein said film serves as a map of said board to determine the location of said discharge.

12. The method according to claim 8 further including the steps of wrapping photographic film about selected circuit components in said generating circuitry.

13. The method according to claim 8 including the further step of analyzing said developed film to determine the density of exposure for determining the magnitude of said discharge.

14. The method according to claim 8 wherein said luminous discharge is an arc discharge.

15. A method according to claim 8 wherein said luminous discharge is a corona discharge.

16. A method of detecting and locating the presence of corona discharge in a high voltage power supply of the type having circuitry enclosed in a housing and having a dielectric liquid within said housing, said dielectric liquid substantially surrounding said circuitry, said method comprising the steps of:

providing photographic film within said housing and immersed in said dielectric liquid at a position in close proximity to said circuitry, operating said circuitry, removing and developing said film whereupon the location of any corona discharge from said circuitry can be identified.

17. A method as claimed in claim 16 wherein said circuitry comprises a printed circuit board.

18. A method as claimed in claim 16 wherein said film is pre-exposed prior to immersion in said dielectric liquid in order to increase the sensitivity of said film.

19. A method as claimed in claim 16 wherein a plurality of pieces of photographic film are provided within said housing each in close proximity to a separate portion of said circuitry.

* * * * *